(12) United States Patent
Marlett

(10) Patent No.: US 6,876,934 B2
(45) Date of Patent: Apr. 5, 2005

(54) METHOD FOR DETERMINING FAULT COVERAGE FROM RTL DESCRIPTION

(75) Inventor: Ralph Marlett, Redwood City, CA (US)

(73) Assignee: Atrenta Inc., San Jose, CA (US)

( * ) Notice: Subject to any disclaimer, the term of this patent is extended or adjusted under 35 U.S.C. 154(b) by 0 days.

(21) Appl. No.: 10/217,535

(22) Filed: Aug. 14, 2002

(65) Prior Publication Data

US 2004/0034495 A1 Feb. 19, 2004

(51) Int. Cl.$^7$ .............................................. G06F 19/00
(52) U.S. Cl. ........................... 702/58; 702/58; 702/81; 702/117; 702/123; 714/31; 714/46; 324/512; 324/531; 326/104; 326/124
(58) Field of Search .............................. 702/57–59, 81, 702/117, 119, 123, 126; 714/31, 46; 324/512, 531; 326/104, 124

(56) References Cited

U.S. PATENT DOCUMENTS

| | | | | |
|---|---|---|---|---|
| 5,568,493 A | * | 10/1996 | Morris | 714/726 |
| 5,604,895 A | * | 2/1997 | Raimi | 703/13 |
| 5,748,497 A | * | 5/1998 | Scott et al. | 702/181 |
| 6,532,440 B1 | * | 3/2003 | Boppana et al. | 703/14 |

OTHER PUBLICATIONS

Ghosh et al., "A Design for Testability Technique for RTL Circuits Using Control/Data Flow Extraction", Jan. 1996, IEEE, pp. 329–336.*

Mao et al., "Improving Gate Level Fault Coverage by RTL Fault Grading", Jan. 1996, IEEE, pp. 150–159.*

* cited by examiner

Primary Examiner—Marc S. Hoff
Assistant Examiner—Elias Desta
(74) Attorney, Agent, or Firm—Sughrue Mion, PLLC

(57) ABSTRACT

A method for evaluating the upper bound fault coverage of an integrated circuit (IC) or a portion thereof from register transfer level (RTL) description is provided. The method requires the analysis of a circuit described in RTL consisting of primary input and output pins as well as devices connected to each other and/or to the primary pins to determine the controllability and observability of each pin of the circuit to 'stuck at zero' and 'stuck at one' conditions. The upper bound fault coverage is then determined based on the ratio between the number of pins that are both controllable and observable and twice the number of pins in the circuit. The method does not require a dynamic simulation for its fault coverage assessment and hence is advantageous over other methods consuming significant time and resources.

40 Claims, 3 Drawing Sheets

Figures

|  |  |  | Controllable | Observable | Score |
|---|---|---|---|---|---|
| Pin 130-1 | | S@0 | Y | Y | 1 |
| | | S@1 | Y | Y | 1 |
| Pin 130-2 | | S@0 | Y | Y | 1 |
| | | S@1 | Y | Y | 1 |
| Pin 130-3 | | S@0 | Y | Y | 1 |
| | | S@1 | Y | Y | 1 |
| Gate 110 | $I_1$ | S@0 | Y | Y | 1 |
| | | S@1 | Y | Y | 1 |
| | $I_2$ | S@0 | Y | Y | 1 |
| | | S@1 | Y | Y | 1 |
| | O | S@0 | Y | Y | 1 |
| | | S@1 | Y | Y | 1 |
| Gate 120 | $I_1$ | S@0 | Y | Y | 1 |
| | | S@1 | Y | Y | 1 |
| | $I_2$ | S@0 | Y | Y | 1 |
| | | S@1 | Y | Y | 1 |
| | O | S@0 | Y | Y | 1 |
| | | S@1 | Y | Y | 1 |
| Pin 140-1 | | S@0 | Y | Y | 1 |
| | | S@1 | Y | Y | 1 |
| | | | | Total | 20 |

| | | | Controllable | Observable | Score |
|---|---|---|---|---|---|
| Pin 330-1 | | S@0 | Y | Y | 1 |
| | | S@1 | Y | Y | 1 |
| Pin 330-2 | | S@0 | Y | N | 0 |
| | | S@1 | Y | N | 0 |
| Pin 330-3 | | S@0 | Y | Y | 1 |
| | | S@1 | N | Y | 0 |
| Gate 310 | $I_1$ | S@0 | Y | N | 0 |
| | | S@1 | Y | N | 0 |
| | $I_2$ | S@0 | Y | Y | 1 |
| | | S@1 | N | Y | 0 |
| | O | S@0 | Y | Y | 1 |
| | | S@1 | N | Y | 0 |
| Gate 320 | $I_1$ | S@0 | Y | Y | 1 |
| | | S@1 | Y | Y | 1 |
| | $I_2$ | S@0 | Y | Y | 1 |
| | | S@1 | N | Y | 0 |
| | O | S@0 | Y | Y | 1 |
| | | S@1 | Y | Y | 1 |
| Pin 340-1 | | S@0 | Y | Y | 1 |
| | | S@1 | Y | Y | 1 |
| | | | | Total | 12 |

METHOD FOR DETERMINING FAULT COVERAGE FROM RTL DESCRIPTION

FIELD OF THE INVENTION

The present invention relates generally to the determination of fault coverage in integrated circuits, and more specifically to estimating fault coverage from an RTL description of an integrated circuit.

BACKGROUND OF THE INVENTION

As integrated circuits (ICs) are gaining in complexity, their respective testing becomes a significant challenge. Designers of ICs containing millions of transistors have relatively limited time to spare on adding facilities for testing a device during manufacturing, and put most of their efforts in the design of their innovative ideas. However, the device must be eventually tested, and must be manufacturable, and therefore various test schemes are added to the actual design. A common practice is adding connected flip-flops (FFs). The FFs are connected in the manner of a long shift register so as to allow control and/or observation of signals. For this purpose, certain FFs that are part of the actual design are made to be scannable. In many cases a special mode, test mode, is used with a single test clock signal to control the entire shifting of data through a scan shift register. In some cases, multiple such scan paths exist in the IC, making the testing of a chip faster.

A challenge for IC design is to provide the highest fault coverage possible. The higher the fault coverage, the more likely it is for a fault to be detected for a device under test, namely a faulty IC being manufactured. One well known method for determining such coverage is the use of fault simulators. These allow a designer to simulate defects in a circuit and find out whether a given set of test vectors (also known as test patterns) can detect the fault.

Some original work was performed by Sandia Labs and published as early as 1979 by L. H. Goldstein, known as SCOAP which stands for Sandia Controllability/Observability Analysis Program, and defines controllability as the ability to set a pin to a certain state or logic value. It further defines observability as the ability to observe the state or logic value of a pin of a circuit at a primary output.

A fault can be a pin stuck at "0" or a pin stuck at "1". Thus, each pin may be thought of in terms to two different pin faults. A fault is detected when the actual value on a primary output (when the fault is present) does not correspond with the expected value on that primary output of a fault free circuit. A fault is testable in this sense if the fault can be detected. Fault detection can be achieved by applying to the primary inputs a stimulus (otherwise known as one or more test vectors) that exercises a fault on a particular pin (i.e. controls the pin to 0 for stuck at 1 (S@1) and to 1 for stuck at 0 (S@0)) and propagates the actual value on that pin so that it may be observed on a primary output.

Fault coverage is the extent to which a set of test vectors can detect faults. For example, if a set of test vectors provides 90 percent fault coverage, it can detect 90 percent of all simulated stuck-at-1 and stuck-at-0 faults in the circuit. Heretofore, fault coverage is something that has been determined using fault simulations and therefore has been a post simulation figure that is perfectly accurate in hindsight. Fault simulations, however, are highly demanding on computer resources as well as time.

Key to many prior art solutions is the requirement to use test vectors and simulate the circuit in order to provide an estimation of the fault coverage or generation of test vectors. Such solutions are proposed by Shupe et al. in U.S. Pat. No. 4,937,765, Kimura et al. in U.S. Pat. No. 6,044,214, Duggirala et al. in U.S. Pat. No. 6,269,463, and Akin in U.S. Pat. No. 6,370,492. A more complex solution requiring two circuits, one being a reference circuit, is proposed by Nozuyama in U.S. Pat. No. 6,151,694, where the fault coverage is evaluated based on a comparison between a circuit under test and a reference circuit. Yet another solution increases the achievable fault coverage in a circuit, particularly in gate arrays, by enabling sampling of data within an actual device using a chain of flip-flops, as proposed by How et al. in U.S. Pat. No. 6,223,313. Similarly, Hosokawa et al., in U.S. Pat. No. 292,915, suggest a method for design to provide high fault coverage in the actual device. Another type of a solution is proposed by Scott et al. in U.S. Pat. No. 6,059,451, where the fault coverage is determined based on the fault detection probability of each node, which is determined based on the signal probability and transfer probability for each node in a netlist.

It would be advantageous to be able to estimate the potentially achievable fault coverage of an IC without the requirement for fault coverage simulations or the calculation of probabilities. It would be further advantageous if such estimation could be performed as early as the RTL description phase of the design stage. With an estimate of achievable fault coverage available prior to fault simulations, the designer could decide whether to modify the design to make it more testable. An estimate of the theoretically achievable fault coverage could also be used as a standard against which test vector sets could be evaluated.

SUMMARY OF THE INVENTION

In one embodiment, the invention is a method for determining fault coverage from an RTL description. Other embodiments include a computer executable code for determining fault coverage from an RTL description, a computer system for implementing a method for determining fault coverage from an RTL description, and a method for determining the requirement for additional test vectors.

BRIEF DESCRIPTION OF THE DRAWINGS

The drawing figures depict, in highly simplified schematic form, embodiments reflecting the principles of the invention. Items and details that will be readily understood by one familiar with this field have been omitted so as to avoid obscuring the invention. In the drawings.

DETAILED DESCRIPTION

Figures 1A, 1B:
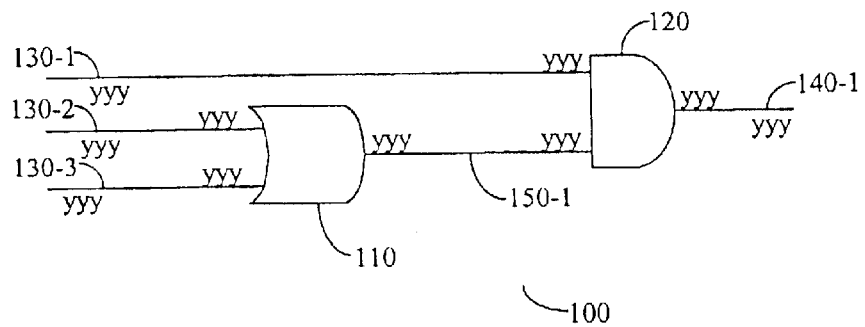
FIG. 1A shows an exemplary circuit for which the upper bound fault coverage is determined in accordance with the disclosed invention.
FIG. 1B shows a table with controllability and observability information relating to the circuit of FIG. 1A.

The invention will now be taught using an exemplary embodiment. Although the embodiment is described in detail, it will be appreciated that the invention is not limited to just this embodiment, but has a scope that is significantly broader. The appended claims should be consulted to determine the true scope of the invention.

Definitions

Computer Systems

One embodiment of this invention resides in a computer system. Here, the term "computer system" is to be understood to include at least a memory and a processor. In general, the memory will store, at one time or another, at least portions of an executable program code (also referred to as computer executable code), and the processor will execute one or more of the instructions included in that executable program code. It will be appreciated that the term "executable program code" and the term "software" mean substantially the same thing for the purposes of this description.

Computer Program Products

On a practical level, the software that enables the computer system to perform the operations described further below in detail, may be supplied on any one of a variety of media. Furthermore, the actual implementation of the approach and operations of the invention are actually statements written in a programming language. Such programming language statements, when executed or interpreted by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents now known or hereafter developed.

One of skill in the art will appreciate that "media", or "computer-readable media", as used here, may include a diskette, a tape, a compact disc, an integrated circuit, a ROM, a CD, a cartridge (regardless of shape such as cartridges shaped like memory sticks, or sized to fit on a key ring, or any other shape) a remote transmission via a communications circuit, or any other similar medium useable by computers, now known or hereafter developed. For example, to supply software for enabling a computer system to operate in accordance with the invention, the supplier might provide a diskette or might transmit the software in some form via satellite transmission, via a wireless link, via a direct telephone link, or via the Internet as a download or in an ASP arrangement. Thus, the term, "computer readable medium" is intended to include all of the foregoing and any other medium by which software may be provided to a computer.

Although the enabling software might be "written on" a diskette, "stored in" an integrated circuit, or "carried over" a communications circuit, it will be appreciated that, for the purposes of this application, the software may be referred to as being "on" the computer readable medium. Thus, the term "on" is intended to encompass the above and all equivalent ways in which software is associated with a computer usable medium.

For the sake of simplicity, therefore, the term "program product" is thus used to refer to a computer useable medium, as defined above, which has on it any form of software to enable a computer system to operate according to the above-identified invention which is described in detail below.

Other Definitions

Herein, the term "pin" is used to mean a point of primary input, primary output, or primary input/output (I/O) to any circuit or IC, as well as an input, output, or I/O of a gate within the IC. A primary pin is a place where the circuit or the IC connects to external components. The term "gate" as used herein shall mean a single logic device or another single electronic device included in a circuit or an IC.

Description

In an IC, a plurality of gates are connected to each other, as well as to primary pins. Such an arrangement is typically described using a register transfer level (RTL) description of such a circuit. A RTL description is a higher level description that does not require all the final gates to be known and allows for easy description of a circuit under design.

Each of the devices has at least a single pin by which it is able to connect to other devices and/or primary pins of the circuit. Each pin may be controllable, observable or both controllable and observable. A pin may be controllable to "0" or controllable to "1" or may not be controllable to a "0" or not controllable to a "1". For the purpose of assessing the controllability of the pins in the IC, each pin is assigned two variables: $C_0$ and $C_1$, which provide information of the pin's controllability to "0" and "1" respectively, each of them capable of receiving either the value "N" or "Y" denoting "no" and "yes" respectively relative to the specific controllability. Therefore a pin having a sequence of "NY" is not be controllable to "0" but is controllable to "1". Similarly each pin can be checked for observability, "O", which can also be defined as "N" or "Y" denoting "no" or "yes", for not being observable or being observable respectively. Hence, if a pin is defined as being "nyy" it would mean that the pin is not controllable to "0", that it is controllable to "1" and that it is observable.

The determination of these values is within the ability of one familiar in this field, and therefore the manner of determining controllability and observability are not discussed further. It is therefore possible to assess the controllability in the case of a pin stuck at 0 [S@0] and a pin stuck at 1 [S@1]. For the purpose of detection of a fault, a pin must be both controllable for that type of fault as well as observable.

Reference is now made to FIG. 1A where a non-limiting example of a circuit 100 is shown. Circuit 100 could be any circuit under consideration, even one much more complex with many more gates and pins. Circuit 100 comprises of three primary input pins, 130-1 through 130-3; one primary output pin, 140-1, and two gates. Firstly, the circuit has an OR gate 110 having two input pins 110-I$_1$ and 110-I$_2$ (not labeled in the figure), connected to primary inputs 130-2 and 130-3 respectively, as well as an output pin 110-O. Secondly the circuit has an AND gate 120 having two input pins 120-I$_1$ and 120-I$_2$, connected to primary input 130-1 and pin 110-O respectively, as well as an output pin 120-O, connected to primary output 140-1. One familiar with this field will understand that all pins in this circuit, including the pins of both gates 110 and 120, are all controllable to both "0" and "1", and are as well observable from the primary output 140-1.

Figure 2:
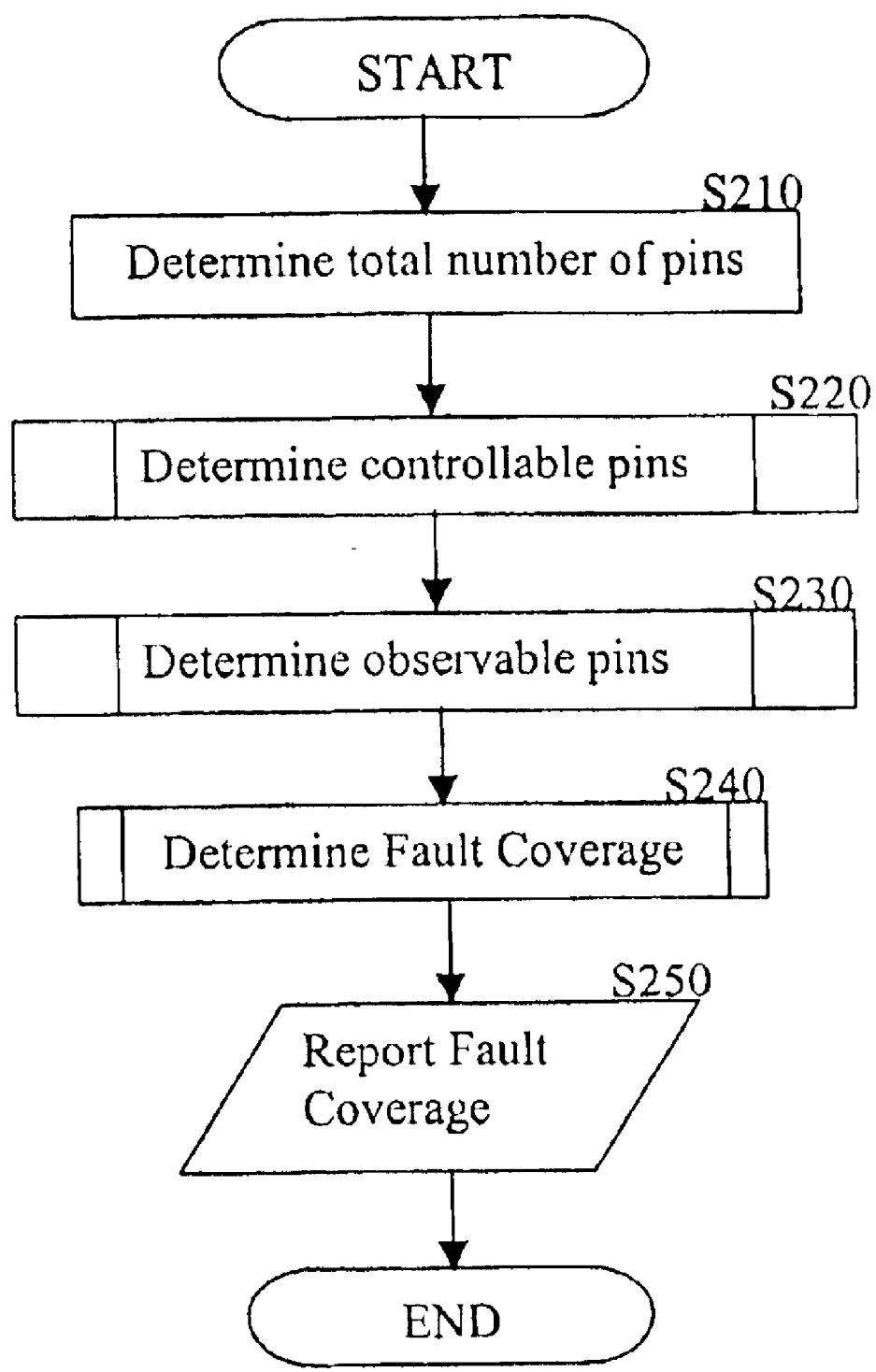
FIG. 2 shows a flow diagram for an exemplary process for estimating fault coverage.

Reference is now made to FIG. 2 which shows an exemplary flowchart of one embodiment of the method for determining the upper limit fault coverage of a circuit. It will be appreciated that deviations from the order of the steps may be possible, and such deviations are meant to be included in the scope of the invention.

In step S210 the total number of pins is determined. Referring back to FIG. 1A there are ten pins in the circuit, four primary pins and three for each of gates 110 and 120. In step S220 it is determined for each pin whether it is controllable to "0" and whether it is controllable to "1", followed by step S230 where the observability of each pin is determined. Then, in step S240 the upper bound of the fault coverage is determined as a ratio between the number of pins that are both controllable and observable for S@0 plus the number of pins that are both controllable and observable for S@1 and twice the number of pins. It should be noted that the reason for using twice the number of pins is to account for both cases of S@0 and S@1 possible for each of the pins involved.

In step S250, a report is optionally provided which may include at least the upper bound fault coverage value, usually provided as a percent value. In addition the pins that do not comply with the full controllability and observability characteristics may also be reported in respect of their RTL description. A designer can then easily modify the design to achieve a higher level of fault coverage. That is to say, a comparison may be made between the upper bound for fault coverage in the present circuit design (present upper bound) and a goal or target upper bound for fault coverage. When the comparison indicates the threshold is not met, the circuit may be redesigned to provide improved possible coverage at an early stage of the design phase.

Furthermore, it would be possible for a designer performing traditional preparation of test vectors to compare the resultant fault coverage to the upper bound fault coverage determined in accordance with the disclosed method. If the values are too far apart, it may be desirable to add test vectors in order to attempt to achieve higher fault coverage for the IC. In other words, when a set of one or more test vectors has a coverage that is not within a predetermined threshold of the estimated maximum coverage, then the set of test vectors can be modified, for example by adding additional test vectors, in an attempt to achieve higher coverage. To put it another way, this approach is a method for identifying a significant discrepancy (i.e., a significant difference in fault coverage) in the fault coverage achieved by a predetermined set of test vectors and a fault coverage upper bound.

Reference is now made to FIG. 1B where a table is shown filled out in accordance with at least some of the steps described in FIG. 2, for the circuit shown in FIG. 1A. For each gate, for example gate 110, all pins are checked for the conditions of S@0 and S@1 for both controllability and observability. For gate 110, pin 110-$I_1$ is both controllable and observable for the S@0 case as well as for the S@1 case. The determination is repeated for each fault possibility in this circuit, in this example a total of twenty, resulting from the fact that there are 10 pins each being able to be at S@0 or S@1. A score is then determined for each of the possible faults. The score is "1" only in the case were the fault is both controllable and observable. In this exemplary circuit all the faults are both controllable and observable and hence the total score is "20". The fault coverage is then calculated in accordance with the method, i.e., dividing the score by the number of pins times two. As the number of pins is ten, as explained above, the result of dividing the score by twice the number of pins is "1", representing an estimated upper bound fault coverage of 100%.

Figures 3A, 3B:
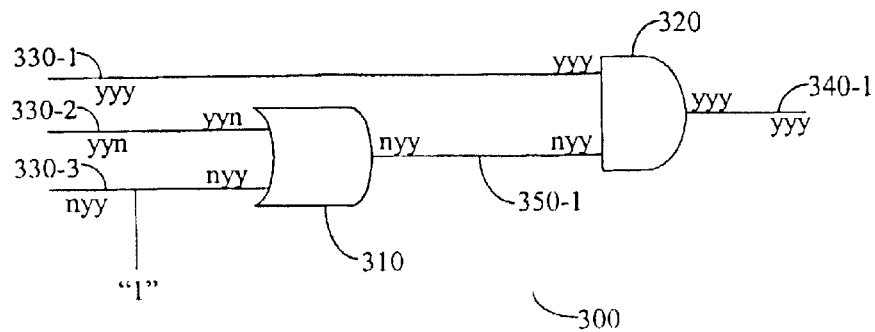
FIG. 3A shows another exemplary circuit for which the upper bound fault coverage is determined.
FIG. 3B shows a table with controllability and observability information relating to the circuit of FIG. 3A.

Reference is now made to FIG. 3A where a circuit 300 is shown generally similar to the circuit shown in FIG. 1A, with the exception that input 330-3 is tied to a logic value of "1". As a result there are several changes in the determination of the controllability and observability of the pins in this circuit. For example, pin 310-$I_2$ and primary input 330-3 are now not controllable to "0", however they are still controllable to "1" and remain observable. This results in a determination that they both have a "nyy" status. Pin 310-$I_1$ of gate 310 and primary input 330-2 are fully controllable, however, due to the fact that pin 330-3 is tied to "1", pin 310-$I_1$ and primary input pin 330-2 are no longer observable as the output of gate 310 is always "1" regardless of the values present on pin 310-$I_1$ and 330-2. Therefore it is now determined that pin 310-$I_1$ is has a "yyn" status. As 310-O is not controllable to "0", because input 310-$I_2$ holds it at "1" we determine that 310-O is not controllable to "0" and therefore this pin is now a "nyy".

Fault coverage can now be determined in accordance with the method disclosed. Reference is now made to FIG. 3B where a table is shown filled out in accordance with at least some of steps described in FIG. 2, for the circuit described in FIG. 3A. For pin 310-$I_1$ it is determined that for S@0 it is controllable but not observable, leading to a score of "0". This score is the result of not having the pin being both controllable and observable for S@0. For pin 310-$I_1$ it is determined that for S@1 it is controllable but not observable, leading to a score of "0". For pin 310-$I_2$ it is determined that for S@0 it is controllable and observable, leading again to a score of "1". For pin 310-$I_2$ it is determined that for S@1 it is not controllable but is observable resulting in a score of "0". This analysis is repeated for each pin of the circuit. Once the score of each and every pin is determined, the total score is found, which in this non-limiting example amounts to a score of "12". Now the fault coverage is determined by finding the ratio between the score and twice the number of pins in the circuit. In this case the ratio is 12/20, giving 60% for the estimated upper bound fault coverage.

Many variations to the above-identified embodiments are possible without departing from the scope and spirit of the invention. Possible variations have been presented throughout the foregoing discussion. Moreover, it will be appreciated that Combinations and subcombinations of the various embodiments described above will occur to those familiar with this field, without departing from the scope and spirit of the invention.

What is claimed is:

1. A method for estimating the upper bound of fault coverage of a digital circuit, said digital circuit having one or more pins, the method comprising:
    a) determining the controllability of each of said one or more pins;
    b) determining the observability of each of said one or more pins;
    c) determining a fault coverage score for said digital circuit based on said controllability and said observability determinations;
    d) determining, as the upper bound fault coverage, a ratio between said fault coverage score and twice the number of said one or more pins.

2. The method of claim 1, wherein each of said pins is at least one of an input pin and an output pin.

3. The method of claim 1, wherein said pins are at least one of gate pins and primary pins.

4. The method of claim 1, further comprising reporting the upper bound fault coverage.

5. The method of claim 1, wherein said determining of controllability comprises determining controllability to "0" and controllability to "1" of each of said one or more pins.

6. The method of claim 1, wherein said determining of said fault coverage score comprises:
    c1) for each pin fault of each of said one or more pins determined as being not controllable, setting a corresponding pin score as "0";

c2) for each pin fault of each of said one or more pins determined as being not observable, setting a corresponding pin score as "0";

c3) for each pin fault of each of said one or more pins determined as being both controllable and observable, setting a corresponding pin score as "1";

c4) adding all of said pin scores to determine said fault coverage score.

7. The method of claim 6, wherein said pin fault is one of said pin being stuck at 0 and said pin being stuck at 1.

8. A computer program product with software instructions, on a computer readable medium, for estimating the upper bound of fault coverage of a digital circuit, said digital circuit having one or more pins, the software instructions defining the steps of:

a) determining the controllability of each of said one or more pins;

b) determining the observability of each of said one or more pins;

c) determining a fault coverage score for said digital circuit based on said controllability and said observability determinations;

d) determining, as the upper bound fault coverage, a ratio between the said fault coverage score and twice the number of said one or more pins.

9. The computer program product of claim 8, wherein each of said pins is at least one of an input pin and an output pin.

10. The computer program product of claim 8, wherein said pins are at least one of gate pins and primary pins.

11. The computer program product of claim 8, further comprising reporting the upper bound fault coverage.

12. The computer program product of claim 8, wherein said determining of controllability comprises determining controllability to "0" and controllability to "1" of each of said one or more pins.

13. The computer program product of claim 8, wherein said determining of said fault coverage score comprises:

c1) for each pin fault of each of said one or more pins determined as being not controllable, setting a corresponding pin score as "0";

c2) for each pin fault of each of said one or more pins determined as being not observable, setting a corresponding pin score as "0";

c3) for each pin fault of each of said one or more pins determined as being both controllable and observable, setting a corresponding pin score as "1";

c4) adding said pin scores to determine said fault coverage score.

14. The computer program product of claim 13, wherein said pin fault is one of said pin being stuck at 0 and said pin being stuck at 1.

15. A computer system adapted to implement a method for determination of the upper bound fault coverage of a digital circuit, comprising:

a processor;

a digital circuit described in register transfer level (RTL), said digital circuit having one or more pins; and a memory including software instructions adapted to enable the computer system to perform the steps of:

determining the controllability of each of said one or more pins;

determining the observability of each of said one or more pins;

determining a fault coverage score for said digital circuit based on said controllability and said observability determinations;

determining, as the upper bound fault coverage, a ratio between said fault coverage score and twice the number of said one or more pins.

16. The computer system of claim 15, wherein each of said pins is at least one of an input pin and an output pin.

17. The computer system of claim 15, wherein said pins are at least one of gate pins and primary pins.

18. The computer system of claim 15, further comprising reporting the upper bound fault coverage.

19. The computer system of claim 15, wherein said determining of controllability comprises determining controllability to "0" and controllability to "1" of each of said one or more pins.

20. The computer system of claim 15, wherein said determining of said fault coverage score comprises:

a) for each pin fault of each of said me or more pins determined as being not controllable, setting a corresponding pin score as "0";

b) for each pin fault of each of said one or more pins determined as being not observable, setting a corresponding pin score as "0";

c) for each pin fault of each of said one or more pins determined as being both controllable and observable, setting a corresponding pin score as "1";

d) adding all of said pin scores to determine said fault coverage score.

21. The computer system of claim 20, wherein said pin fault is one of said pin being stuck at 0 and said pin being stuck at 1.

22. A method for determining the existence of a significant discrepancy in the fault coverage achieved by a set of test vectors and an upper bound fault coverage value of a digital circuit, said method comprising:

a) determining the upper bound fault coverage of said digital circuit;

b) generating the set of test vectors for use on said digital circuit;

c) performing a simulation on said digital circuit using said test vectors;

d) determining a fault coverage for said digital circuit based on said simulation;

e) comparing said fault coverage with said fault coverage upper bound to determine the fault coverage difference.

23. The method of claim 22, wherein said method further comprises repeating b) through e) when the fault coverage difference is above a predetermined threshold.

24. The method of claim 22, wherein:

said digital circuit has one or more pins;

the determining of the upper bound fault coverage of said digital circuit comprises:

a1) determining the controllability of each of said one or more pins;

a2) determining the observability of each of said one or more pins;

a3) determining a fault coverage score for said digital circuit based on said controllability and said observability determinations;

a4) determining, as the upper bound fault coverage, a ratio between the said fault coverage score and twice the number of said one or more pins.

25. The method of claim 24, wherein each of said pins is at least one of an input pin and an output pin.

26. The method of claim 24, wherein said pins are at least one of gate pins and primary pins.

27. The method of claim 24, wherein said determining of controllability comprises determining controllability to "0" and controllability to "1" of each of said one or more pins.

28. The method of claim 22, wherein said determining of said fault coverage score comprises:
   c1) for each pin fault of each of said one or more pins determined as being not controllable, setting a corresponding pin score as "0";
   c2) for each pin fault of each of said one or more pins determined as being not observable, setting a corresponding pin score as"0";
   c3) for each pin fault of each of said one or more pins determined as being both controllable and observable, setting a corresponding pin score as "1";
   c4) adding said pin scores to determine said fault coverage score.

29. The method of claim 28, wherein said pin fault is one of said pin being stuck at 0 and said pin being stuck at 1.

30. A method for circuit design, comprising:
   determining an upper bound fault coverage, of a design of a digital circuit, to obtain a present upper bound fault coverage;
   making a comparison between the present upper bound fault coverage and a target upper bound fault coverage; and
   modifying the design of the digital circuit when the comparison indicates that said target upper bound fault coverage is not met.

31. The method for circuit design as set forth in claim 30, wherein the design of the digital circuit is an RTL description.

32. The method for circuit design as set forth in claim 31, wherein the modifying is performed so as to provide a modified RTL description with an increased respective present upper bound fault coverage.

33. A circuit designed according to the method as set forth in claim 30.

34. The method of claim 30, wherein:
   said digital circuit has one or more pins;
   the determining of the upper bound fault coverage comprises:
      a) determining the controllability of each of said one or more pins;
      b) determining the observability of each of one or more said pins;
      c) determining a fault coverage score for said digital circuit based on said controllability and said observability determinations;
      d) determining, as the upper bound fault coverage, a ratio between the said fault coverage score and twice the number of said one or more pins.

35. The method of claim 34, wherein each of said pins is at least one of an input pin and an output pin.

36. The method of claim 34, wherein said pins are at least one of gate pins and primary pins.

37. The method of claim 34, further comprising reporting the upper bound fault coverage.

38. The method of claim 34, wherein said determining of controllability comprises determining controllability to "0" and controllability to "1" of each of said one or more pins.

39. The method of claim 34, wherein said determining of said fault coverage score comprises:
   c1) for each pin fault of each of said one or more pins determined as being not controllable, setting a corresponding pin score as "0";
   c2) for each pin fault of each of said one or more pins determined as being not observable, setting a corresponding pin score as"0";
   c3) for each pin fault of each of said one or more pins determined as being both controllable and observable, setting a corresponding pin score as "1";
   c4) adding all of said pin scores to determine said fault coverage score.

40. The method of claim 39, wherein said pin fault is one of said pin being stuck at 0 and said pin being stuck at 1.

* * * * *